(12) United States Patent
Demange et al.

(10) Patent No.: US 6,872,996 B2
(45) Date of Patent: *Mar. 29, 2005

(54) METHOD OF FABRICATING A FERROELECTRIC STACKED MEMORY CELL

(75) Inventors: Nicolas Demange, Lessy (FR); Raffaele Zambrano, Viagrande (IT)

(73) Assignees: STMicroelectronics S.r.l., Agrate Brianza (IT); STMicroelectronics S.A., Montrouge (FR)

(*) Notice: Subject to any disclaimer, the term of this patent is extended or adjusted under 35 U.S.C. 154(b) by 0 days.

This patent is subject to a terminal disclaimer.

(21) Appl. No.: 10/621,262

(22) Filed: Jul. 15, 2003

(65) Prior Publication Data

US 2004/0058493 A1 Mar. 25, 2004

Related U.S. Application Data

(60) Continuation-in-part of application No. 09/911,637, filed on Jul. 23, 2001, now Pat. No. 6,656,801, which is a division of application No. 09/365,187, filed on Aug. 2, 1999, now Pat. No. 6,300,654.

(30) Foreign Application Priority Data

Apr. 30, 1999 (IT) ........................................ TO99A0356

(51) Int. Cl.[7] ................................................ H01G 7/06
(52) U.S. Cl. ........................................ 257/295; 257/306
(58) Field of Search .................................. 257/295–310

(56) References Cited

U.S. PATENT DOCUMENTS

| | | | |
|---|---|---|---|
| 5,350,705 A | 9/1994 | Brassington et al. | 257/295 |
| 5,418,388 A | 5/1995 | Okudaira et al. | 257/295 |
| 5,519,237 A | 5/1996 | Itoh et al. | 257/306 |
| 5,796,133 A | 8/1998 | Kwon et al. | 257/295 |
| 5,796,136 A | 8/1998 | Shinkawata | 365/306 |
| 5,955,758 A | 9/1999 | Sandhu et al. | 257/306 |
| 6,028,361 A | 2/2000 | Ooishi | 257/774 |
| 6,063,656 A | 5/2000 | Clampitt | 438/239 |

OTHER PUBLICATIONS

Amanuma, K. et al., "Capacitor–on–Metal/Via–stacked––Plug (CMVP) Memory Cell for 0.25um CMOS Embedded Fe RAM", *IEEE*, 1998, p. 363–366.

Jones, Robert E. Jr., "Integration of Ferroelectric Nonvolatile Memories," *Solid State Technology*, Oct. 1997, pp. 201–210.

Takashima, D. et al., "A Sub–40ns Random–Access Chain FRAM Architecture with a 7ns Cell–Plate–Line Drive," *IEEE International Solid–State Circuits Conference*, 1999, pp. 102–103.

Yamazaki, T., et al., "Advanced 0.5um FRAM Device Technology with Full Compatibility of Half–Micron CMOS Logic device", *Advanced Process Integration Department, Fujitsu Limited*. (4 pages).

*Primary Examiner*—H. Jey Tsai
(74) *Attorney, Agent, or Firm*—Lisa K. Jorgenson; Robert Iannucci; Seed IP Law Group PLLC

(57) ABSTRACT

The cells of the stacked type each comprise a MOS transistor formed in an active region of a substrate of semiconductor material and a capacitor formed above the active region; each MOS transistor has a first and a second conductive region and a control electrode and each capacitor has a first and a second plate separated by a dielectric region material, for example, ferroelectric one. The first conductive region of each MOS transistor is connected to the first plate of a respective capacitor, the second conductive region of each MOS transistor is connected to a respective bit line, the control electrode of each MOS transistor is connected to a respective word line, the second plate of each capacitor is connected to a respective plate line. The plate lines run perpendicular to the bit line and parallel to the word lines. At least two cells adjacent in a parallel direction to the bit lines share the same dielectric region material and the same plate line. In this way, the manufacturing process is not critical and the size of the cells is minimal.

21 Claims, 5 Drawing Sheets

METHOD OF FABRICATING A FERROELECTRIC STACKED MEMORY CELL

CROSS-REFERENCE TO RELATED APPLICATIONS

This application is a continuation-in-part of allowed U.S. patent application Ser. No. 09/911,637, filed Jul. 23, 2001, now U.S. Pat. No. 6,656,801, which is a divisional of U.S. patent application Ser. No. 09/365,178, filed Aug. 2, 1999, which issued as U.S. Pat. No. 6,300,650, both applications and the patent being incorporated herein by reference.

BACKGROUND OF THE INVENTION

1. Field of the Invention

The present invention refers to a stacked type of memory cell structure. In particular, the memory cell described is of the ferroelectric non-volatile type, but the same structure can be used for DRAM cells.

2. Description of the Related Art

As is known and shown in FIG. 1, a ferroelectric cell 1 is composed of a MOS transistor 2 and a capacitor 3 having, as a dielectric, a ferroelectric material, for example PZT ($PbZr_{1-x}Ti_xO_3$, perovskite) or SBT ($SrBi_2Ta_2O_9$, layered perovskite). In detail, in the ferroelectric cell 1, the NMOS-type transistor 2 has a source terminal 4 connected to a bit line BL, a gate electrode 5 connected to a word line WL and a drain terminal 6 connected to a first plate 7 of the capacitor 3. A second plate 8 of the capacitor 3 is connected to a plate line PL.

The cell is capable of storing binary information thanks to the hysteresis characteristics of the ferroelectric material which is sandwiched between the plates 7 and 8 and which, when there are no applied voltages, can assume two bias states depending on the sign of previously-applied voltage across the capacitor 3 terminals.

All currently-known ferroelectric cells can be classified into two families: strapped cells and stacked cells.

In strapped cells, an embodiment of which is shown in FIG. 2, the capacitor 3 is constructed above a field oxide region 10 that delimits an active area 11 of the substrate 12 in which the conductive regions (source 13 and drain 14) of the transistor 2 are formed. In detail, the first plate 7 of the capacitor 3 is here placed on top and is made of a square- or rectangular-shaped region of conductive material (for example, platinum), connected to the drain region 14 of the transistor 2 through a metallic connection line 16; the second plate 8 of the capacitor 3 is here placed underneath and is made by a band of conductive material (for example, platinum again) which runs perpendicular to the drawing plane and forms a plate line PL, connected to other capacitors of adjacent cells; a dielectric region 17, of ferroelectric material, is sandwiched between the first plate 7 and the second plate 8. The gate electrode 5 of the transistor 2 is made of a band of polycrystalline silicon which runs perpendicular to the drawing plane and forms a word line WL.

In stacked cells, an embodiment of which can be seen in FIG. 3, the capacitor 3 is constructed above the active area 11, directly above the drain region 14 of the transistor 2. In this case, the first plate 7 of the capacitor 3 is placed underneath and is made by a square- or rectangular-shaped region of conductive material (for example, platinum) connected to the drain region 14 through a contact 23 formed in an opening of a protective layer 24 (for example BPSG) and the second plate 8, of conductive material, is placed above and is connected to a metalization band 25 defining the plate line PL.

A titanium/titanium nitride region 26 runs below the first plate 7 to help the adhesion of the first plate 7 of the capacitor 3 on the protective layer 24.

The architecture of a array 28 of ferroelectric stacked or strapped cells 1 is shown in FIG. 4. It will be noted that the ferroelectric cells 1 are placed on rows and columns and are coupled so that the cell pairs 27 are placed parallel to bit lines BL; the transistors 2 of each cell pair 27 have common source regions, connected to the same bit line BL; and the capacitors 3 belonging to the cell pairs 27 adjacent in a parallel direction to the bit lines BL are connected to adjacent plate line pairs PL.

Ferroelectric stacked cells 1 are currently preferred, since they are the only ones capable of meeting the scalability requirements of new CMOS technologies. In stacked cells, the layout rules on the capacitor 3 design are crucial for the optimization of the cell.

SUMMARY OF THE INVENTION

There are therefore several known embodiments for stacked cells, apart from that shown in FIG. 3, in which both plates 7,8 and dielectric region 17 are defined using a single mask and forming the plate line PL via a special metallic band. For example, according to another known arrangement, the first (lower) electrode 7 is formed by a separately-shaped conductive region, while the dielectric region 17 and the second (upper) electrode 8 are mutually aligned and shaped using a single mask.

In all these cases, the connection of at least one of the plates 7,8 with the same mask used for the connection of the ferroelectric material composing the dielectric region 17 is critical; for example, during connection, slightly volatile components are formed, and these can be redeposited along the capacitor edge and damage its active zone, causing a decay in the ferroelectric properties of the capacitor, with an increase in edge losses and lower voltage strength.

On the other hand, the separate definition of the three parts constituting the capacitor 3 (first and second plates 7,8 and dielectric region 17), which would allow the problem presented by current manufacturing processes to be solved, causes an increase in overall dimensions that is in conflict with present trends towards miniaturization. In fact, in making definition masks, account must be taken of both manufacturing tolerances (at present, with a 0.35 $\mu$m process, equal to 0.2 $\mu$m) and the minimum distances between the lower adjacent plates and the upper adjacent plates (for example, equal to 0.4 $\mu$m). In particular, with the conditions given above, it would be necessary for the lower plate 7 to be wider, with respect to the dielectric region 7, by an amount at least equal to the manufacturing tolerance (at least 0.2 $\mu$m) on each side; similarly, it would be necessary for the dielectric region 17 to be wider, with respect to the upper plate 8, by the same amount; therefore, taking into account the minimum distance between the lower plates 7, the resulting overall dimensions for the capacitors 3 and consequently for the ferroelectric cells are excessive.

An object the present invention is making a stacked memory cell, without the described disadvantages. According to the present invention, a stacked memory cell is realized as claimed in claim 1.

In practice, according to the invention, the dielectric regions of at least two adjacent cells in the direction of the bit lines are no longer separate. In particular, the dielectric region 17 can be continuous and shared between the two adjacent capacitors belonging to pairs of adjacent cells. In this way, the layout definition rules for capacitor scalability are given only by the distance between two lower adjacent electrodes and by the lateral space (enclosure) between upper electrode and lower electrode. This allows, with the same cell area, maximizing the working area of the capacitor compared with the layout of the arrangement where three different masks for definition of the capacitor are used and the dielectric region is divided between adjacent cells in the direction of the bit lines. This causes an increase in signal amplitude (proportional to the active area of the capacitor) supplied by each cell to the sense amplifier during reading. Alternatively, it is possible to obtain a reduction in the area occupied by the ferroelectric cells.

BRIEF DESCRIPTION OF THE DRAWINGS

For a better understanding of the invention, an embodiment thereof will now be described, merely as a non-limiting example and with reference to the enclosed drawings, in which.

DETAILED DESCRIPTION OF THE INVENTION

Figure 5:
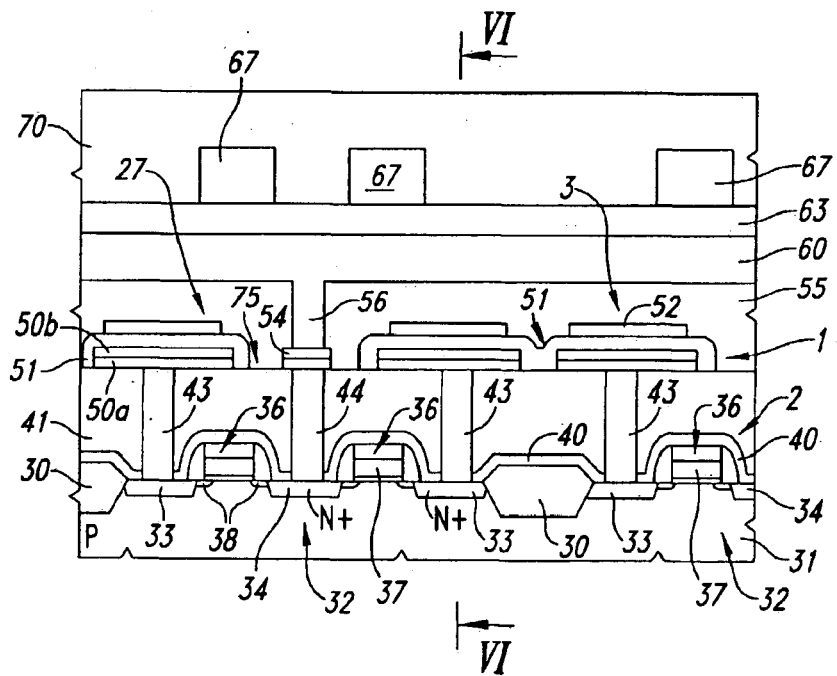
FIG. 5 shows a cross-section through a slice of semiconductor material in which cells have been constructed according to the invention, taken along section line V—V in FIG. 7.
Figure 6:
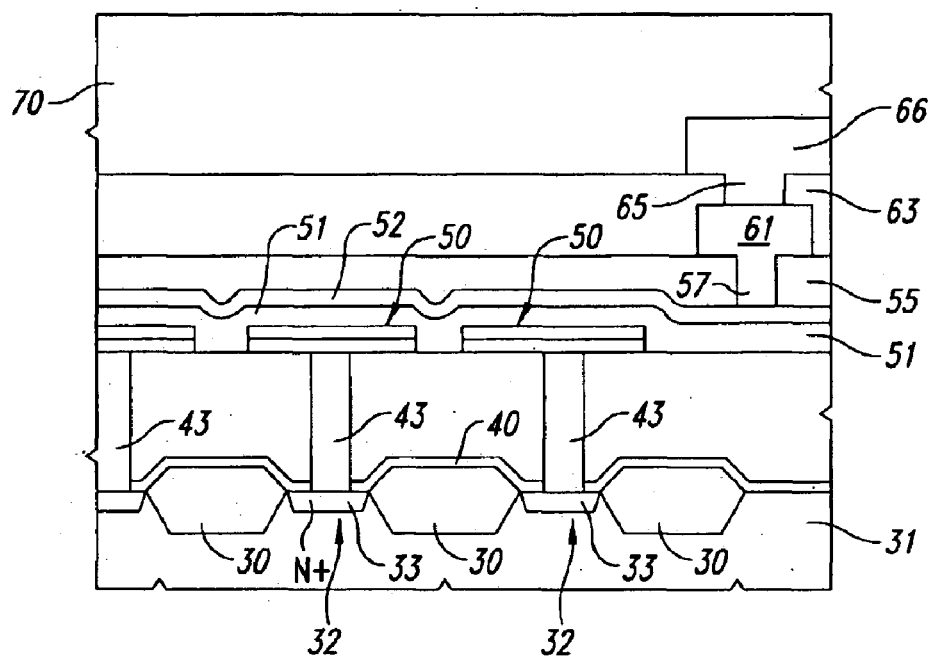
FIG. 6 shows a transverse section of ferroelectric cells according to the invention, taken along section line VI—VI in FIG. 5.
Figure 7:
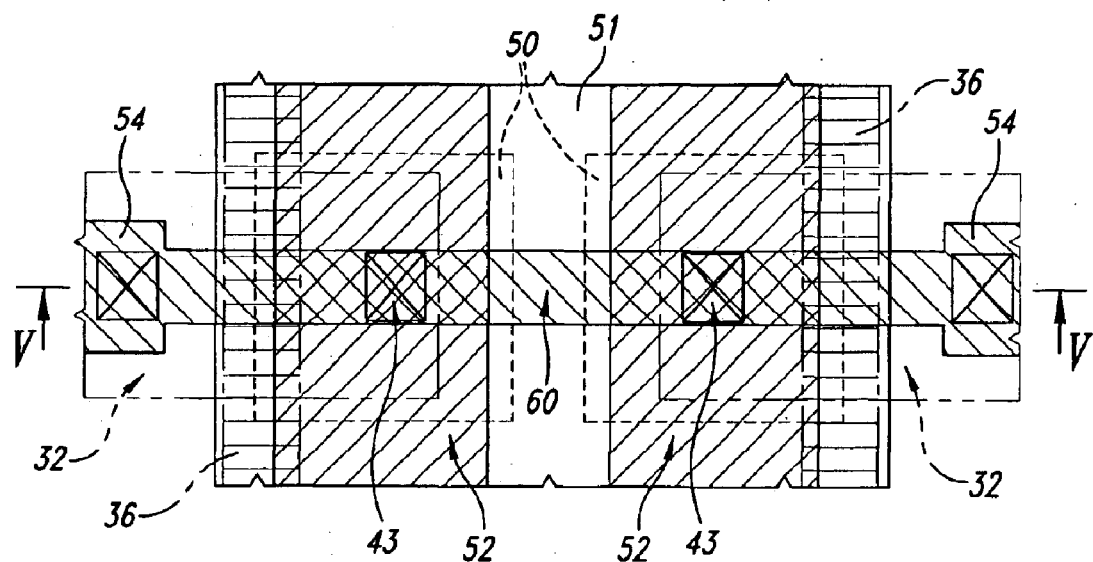
FIG. 7 shows the layout of two cells adjacent to each other, according to the invention.

FIGS. 5–7 show stacked cells 1 constructed according to the invention. The present description refers to ferroelectric cells in particular, without being restricted to these.

In detail, FIG. 5 shows a pair of cells 27 and a single ferroelectric cell 1 adjacent to the pair of cells 27 in the direction of the bit lines (horizontal direction in FIG. 5). Pairs of adjacent cells 27 are insulated from each other by a thick oxide layer 30 (field oxide) which delimits, inside a P-type substrate 31, active areas 32 in which two drain regions 33 and a common $N^+$ type source region 34 are formed. In a known way, gate electrodes 36 are formed above the substrate 31 and are insulated therefrom by a thin oxide layer 37. The gate electrodes 36 are preferably made by bands comprising a double layer of polycrystalline silicon and tungsten silicide running perpendicular to FIG. 5 and defining word lines; the gate electrodes 36 are also laterally flanked by oxide spacers 38.

Less doped drain extension regions 39 are formed in the substrate 31 below spacers 38 and a protective oxide layer 40 covers the surface of the substrate 31.

A first insulating layer 41 (for examples made of Boron Phosphorous Silicon Glass, or BPSG) runs above the protective oxide layer 40 and has openings into which run first and second contacts 43, 44 made of conductive material, for contacting the drain regions 33 and, respectively, the source regions 34.

Figure 1:
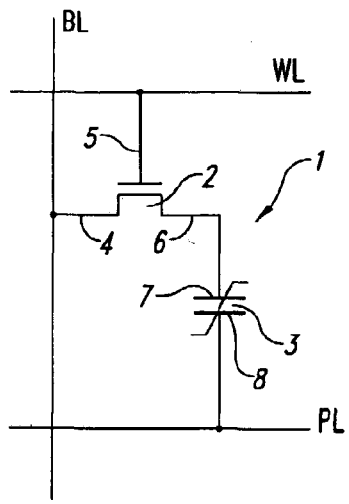
FIG. 1 shows the equivalent electrical diagram of a known ferroelectric cell.
Figure 2:
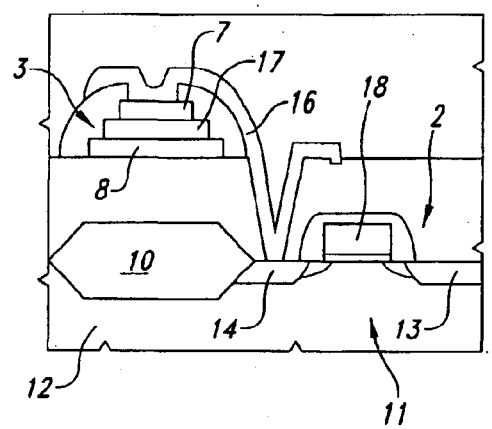
FIG. 2 shows a cross-section through a first known type of ferroelectric cell.
Figure 3:
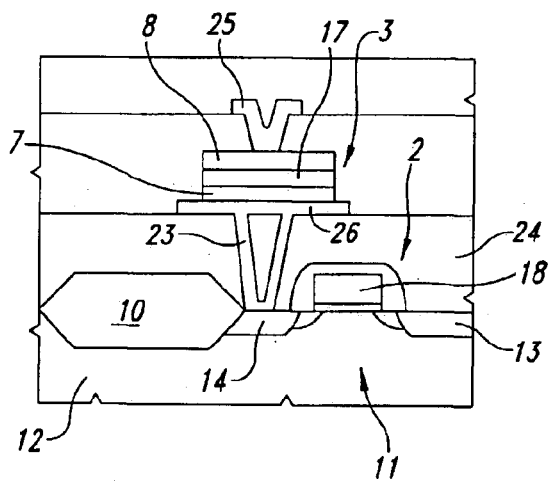
FIG. 3 shows a cross-section through a second known type of ferroelectric cell.
Figure 4:
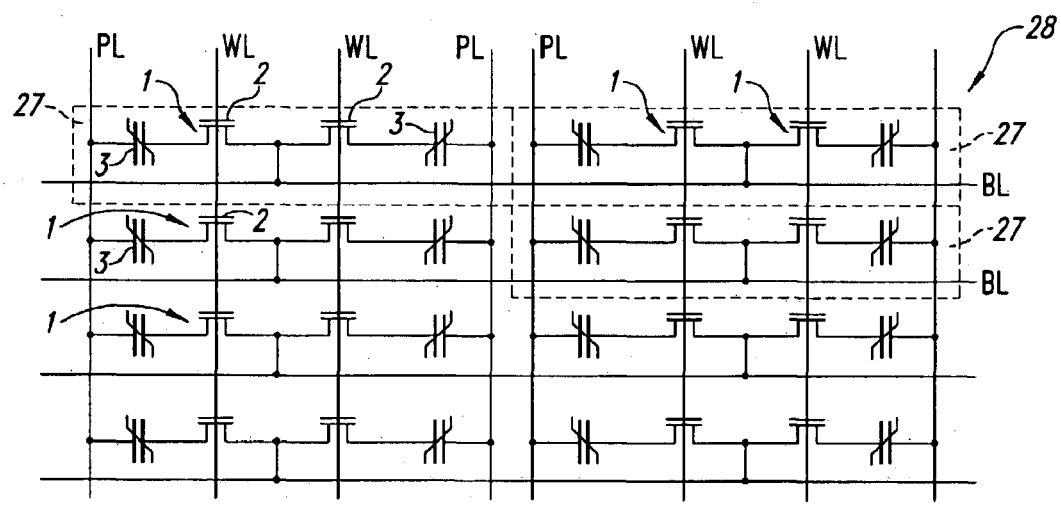
FIG. 4 shows the known architecture of a memory cell array of the type under consideration.

Above the first insulating layer 41, there are formed lower plates 50 (corresponding to the first plates 7 in FIG. 3) electrically connected to the first contacts 43; preferably, the lower plates 50 are composed of a lower portion 50a made of titanium and an upper portion 50b made of platinum. Bands of ferroelectric material 51 run, without gaps, above and between adjacent pairs of lower plates 50, belonging to different pair of cells 27; in addition, the bands of ferroelectric material 51 continuously run above and between the lower plates 50 of adjacent cells in the cross section of FIG. 6, as also shown in the layout of FIG. 7.

Above the bands of ferroelectric material 51, there are first bands of conductive material 52 forming upper plates (corresponding to the second plates 8 in FIG. 3) of the capacitors 3; the first bands of conductive material 52 compose plate lines PL and, as is clear from FIG. 7, have a smaller width compared to the lower plates 50.

Above the first insulating layer 41, there are also formed first contact regions 54, overlying and directly connected to the second contacts 44; the first contact regions 54 are also made preferably using a double layer of titanium and platinum.

A second insulating layer 55 is formed above the first insulating layer 41, covering the first bands of conductive material 52; openings are formed through the second insulating layer 55, into which third contacts 56 run (FIG. 5), directly connected to the first contact regions 54, and openings into which fourth contacts 57 run (FIG. 6), directly connected to the first bands of conductive material 52. Above the second insulating layer 55 metalization lines 60 are formed that define the bit lines BL and are directly connected to the third contacts 56; in addition, second contact regions 61 are formed (FIG. 6) directly connected to the fourth contacts 57. The metalization lines 60 and the second contact regions 61 are formed in the first metalization level.

Above the second insulating layer 55, completely covering the metalization lines 60, there runs a third insulating layer 63, showing openings into which fifth contacts 65 run (FIG. 6) directly connected to the second contact regions 61; above the third insulating layer 63, third contact regions 66 are formed, directly connected to the fifth contacts 65 and made in the second level of metalization, as well as second bands of conductive material 67, connected, in a way not shown, to the word lines forming the gate electrodes 36.

A passivation layer 70 completely covers the device.

Purely by way of example, possible values relative to the regions which compose the ferroelectric cell 1 are given hereinbelow. The area of the capacitor 2 is in the range between 1 and 5 $\mu m^2$; the lower titanium portion 50a of the lower plate is 20 nm thick; the upper platinum portion 50b has a thickness between 100 and 200 nm; the layer of ferroelectric material 51 has a thickness between 50 and 250 nm, and is preferably equal to 100 nm; the first bands of conductive material 52 are approximately 200 nm thick.

The process for manufacturing the ferroelectric cells 1 shown in FIGS. 5–7 is as follows. After having made the transistors 2, having covered with the first insulating layer 41 and having made the first and second contacts 43, 44, in a way known per se, a layer of titanium and then a layer of platinum are made (for example, by sputtering deposition); the lower plates 50 are defined via a first mask (connection of platinum and titanium layers); a layer of ferroelectric material is laid and then a layer of platinum is laid (for example, by sputtering deposition). Then, using a second mask, the first bands of conductive material 52 (connection of platinum layer) are defined and, using a third mask, the bands of ferroelectric material 51 are defined.

The advantages that can be obtained with the present invention are as follows. First of all, the ratio between capacitor 3 area and total cell 1 area is maximized. In fact, the restrictive rules in the cell design must now take into account only the distance between the two lower plates 50 belonging to adjacent pairs of cells 27 and the enclosure between the edges of the lower plate 50 and of the first band of conductive material 52 of each cell.

In addition, critical points in the steps of photolithography and ferroelectric material connection are removed.

Studies by the applicant have shown that the parasitic ferroelectric capacitor formed between two capacitors 3 belonging to two pairs of adjacent cells 27 on the same row does not prejudice the correct operation of the ferroelectric cells 1, given the increased thickness of the dielectric between the two plates 50 and the reduced facing area of the two plates 50 themselves. In addition, the ratio between the active capacitance (capacitance of capacitors 3) and the parasitic capacitance improves with the reduction in thickness of the lower plate 50 and of the layer of ferroelectric material 51 and therefore tends to be reduced with the increase in miniaturization of the devices, expected in the next technological generations.

Figure 8:
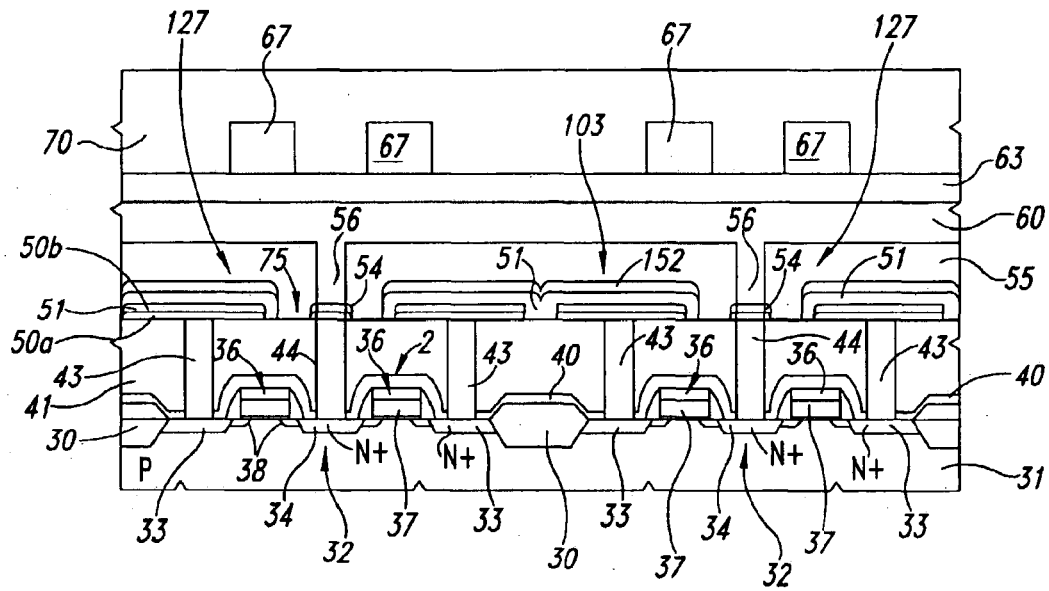
FIG. 8 shows a cross-section through a slice of semiconductor material in which cells have been constructed according to a further embodiment of the invention, taken along section line VIII—VIII in FIG. 9.
Figure 9:
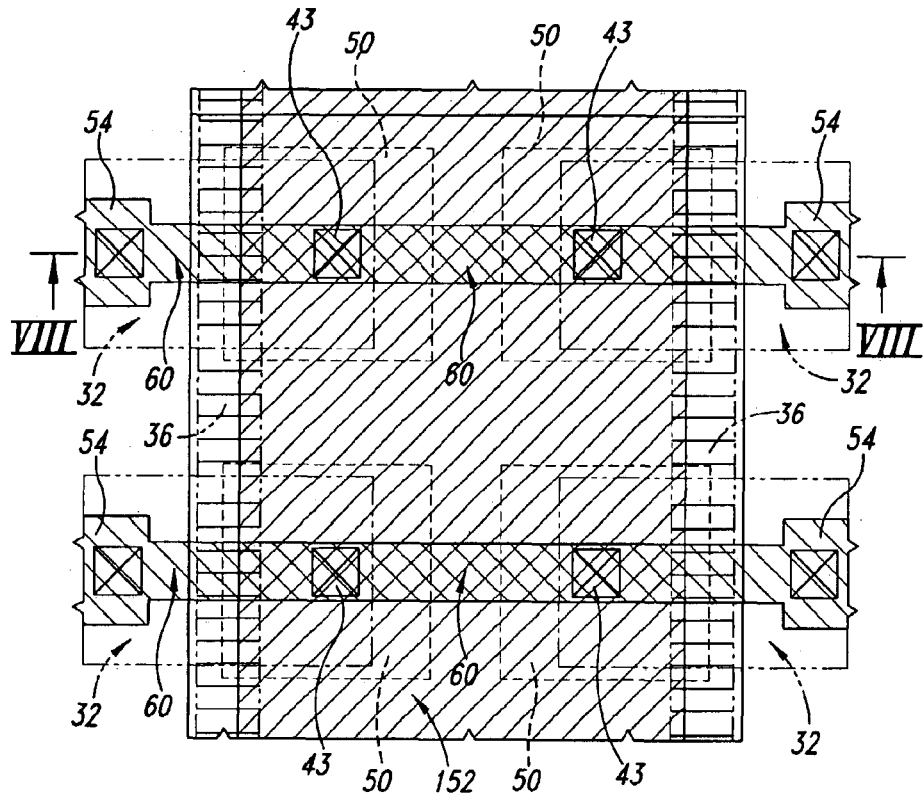
FIG. 9 shows the layout of two pairs of cells adjacent to each other, according to the further embodiment of the invention.
Figure 10:
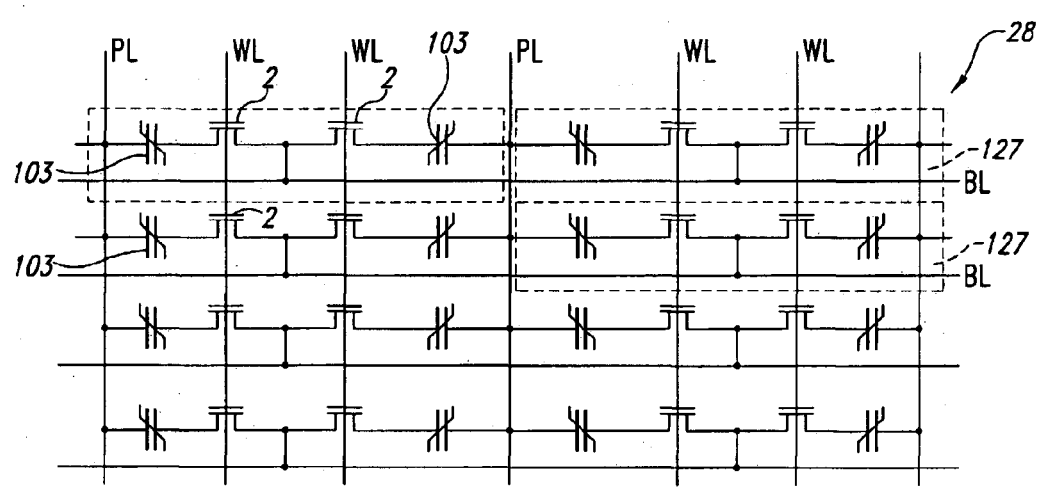
FIG. 10 shows the architecture of a memory cell array comprising cells according to the further embodiment of FIGS. 8 and 9.

Another embodiment is illustrated in FIGS. 8–10, where parts already shown are indicated with the same reference numbers. In detail, FIG. 8 shows two pair of cells 127 arranged adjacent to each other in the direction of the bit lines (horizontal direction in FIG. 8). Above the first insulating layer 41, there are the lower plates 50 (corresponding to the first plates 7 in FIG. 3) of the capacitors 103, which are electrically connected to respective drain regions 33 in the substrate 31 through the first contacts 43. Bands of ferroelectric material 51 run, without gaps, above and between adjacent pairs of lower plates 50, belonging to different pair of cells 127; in addition, the bands of ferroelectric material 51 continuously run above and between the lower plates 50 of adjacent cells in the cross section of FIG. 6, as also shown in the layout of FIG. 7.

Bands of conductive material 152 extend above and in contact with the bands of ferroelectric material 51; furthermore, the bands of conductive material 152 and the bands of ferroelectric material 51 have the same width and are aligned to each other. In detail, the bands of conductive material 152 as well run, without gaps, above and between adjacent pairs of lower plates 50, belonging to different, adjacent pair of cells 127; in addition, the bands of conductive material 152 continuously run above and between the lower plates 50 of adjacent cells in a direction perpendicular to the bit lines 60, as also shown in the layout of FIG. 9 (a cross section along a line corresponding to the line VI—VI of FIG. 5 is identical to FIG. 6).

The bands of conductive material 152 form upper plates (corresponding to the second plates 8 in FIG. 3) of the capacitors 103 and compose common plate lines PL as well. More precisely, the upper plates of adjacent capacitors 103 belonging to different pair of cells 127 and the corresponding common plate line PL are made from the same band of conductive material 152, which is thus shared therebetween.

Hence, as also schematically shown in the electric diagram of FIG. 10, the upper plates of adjacent capacitors 103 belonging to different pair of cells 127 are connected to the same common plate line PL. Cells belonging to different pair of cells 127 and arranged adjacent to each other in the direction of the bit lines 60 may be individually addressed through the respective word lines WL, which are still separated.

The process for manufacturing the ferroelectric cells shown in FIGS. 8–10 initially envisages the same steps as the process for manufacturing the ferroelectric cells 1. In particular, after having made the transistors 2, having covered with the first insulating layer 41 and having made the first and second contacts 43, 44, in a way known per se, a layer of titanium and then a layer of platinum are deposited (for example, by sputtering deposition); the lower plates 50 are defined via a first mask (etch of platinum and titanium layers); a layer of ferroelectric material is deposited and then a layer of platinum is deposited (for example, by sputtering deposition). Then, both the platinum layer and the ferroelectric layer are sequentially defined via a single second mask, to form the bands of conductive material 152 (plate lines) and the bands of ferroelectric material 51. Defining the conductive bands 152 and the ferroelectric bands 51 using a single mask ensures that the bands 152, 51 are completely aligned with one another. That is, each conductive band 152 is coextensive with (i.e., has the same length and width as), and directly on, a corresponding one of the ferroelectric bands 51 to form the upper plates and ferroelectric layers of the capacitors 103 that are adjacent to each other in a first direction and a second direction perpendicular to the first direction.

The embodiment described with reference to FIGS. 8–10 has the following advantages. First, the area of each capacitor is significantly increased without increasing the area of the cells. Moreover, the manufacturing process is simplified, since the band of ferroelectric material and the upper plates of the capacitors are defined using a single mask instead of two. Another important advantage of using a single mask resides in that possible misalignments between the band of ferroelectric material and the upper plates of the capacitors are prevented.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is evident that modifications and variations can be made to the described cell, still remaining within the scope of the present invention.

For example, the layer of ferroelectric material 51 can run over the whole surface of the first insulating layer 41 except for the zones where the first contact regions 54 have to be made (openings 75 in FIG. 5); the materials can differ from those described, as long as they are suitable for the functions required; the exact arrangement of the areas and their dimensions can differ from those described above.

What is claimed is:

1. A memory array, comprising:
   a plurality of stacked cells, each cell including:
   a MOS transistor formed in an active region of a substrate of semiconductor material, the MOS transistor having first and second conduction regions and a control electrode;
   a capacitor formed directly above the first conduction region of the MOS transistor of the cell and having first and second plates separated by a dielectric material region; and
   an electrical connector contacting a bottom of said first plate of the capacitor of the cell and connecting said first conductive region of the MOS transistor of the cell to said first plate of the capacitor of the cell;

a plurality of bit lines connected to said second conductive regions of said MOS transistors of respective cells of the plurality of stacked cells;

a plurality of word lines connected to said control electrodes of respective said MOS transistors of the plurality of stacked cells;

a plurality of plate lines connected to said second plate of respective said capacitors, said plate lines running perpendicular to said bit lines and parallel to said word lines;

wherein a pair of cells adjacent to each other in a direction parallel to said bit lines share a same dielectric material region and a same third conductive region, forming said second plates of said capacitors of said pair of cells.

2. The memory array according to claim 1, wherein said first plates of said capacitors form lower plates and said same dielectric material region runs above and between the lower plates of said two adjacent cells.

3. The memory array according to claim 2, wherein said same dielectric material region runs also on sides not facing each other of said lower plates of said two adjacent cells.

4. The memory array according to claim 1, wherein said same dielectric material region is shaped as a band running in parallel to said respective plate line.

5. The memory array according to claim 1, wherein said same third conductive region is positioned on and coextensive with said same dielectric region.

6. The memory array according to claim 5, wherein said same third conductive region has the same width as said same dielectric region, in said direction parallel to said bit lines.

7. The memory array according to claim 1, wherein said dielectric material region is made of ferroelectric material.

8. A memory array, comprising:

a substrate of semiconductor material;

a first stacked cell comprising a first transistor formed in a first active region of the substrate and a first capacitor formed above the first active region, the first capacitor having a first plate and a second plate separated by a first dielectric region;

a second stacked cell comprising a second transistor formed in a second active region of the substrate and a second capacitor formed above the second active region, the second capacitor having a first plate and a second plate separated by a second dielectric region that is continuous with the first dielectric region, the second plate of the second capacitor being continuous with the second plate of the first capacitor; and a third stacked cell comprising a third transistor formed in a third active region of the substrate and a third capacitor formed above the third active region, the third capacitor having a first plate and a second plate separated from each other by a third dielectric region that is continuous with the first and second dielectric regions, the second plate of the third capacitor being continuous with the second plates of the first capacitor and the second capacitor, the first and second capacitors being positioned in a first plane that is transverse to a second plane in which the second and third capacitors are positioned.

9. The memory array according to claim 8, wherein said first plates of said capacitors form lower plates and said dielectric regions are part of a dielectric layer that runs above and between the lower plates of said capacitors.

10. The memory array according to claim 9, wherein said dielectric layer runs also on sides not facing each other of said lower plates of said capacitors.

11. The memory array according to claim 8, wherein said dielectric regions are part of a dielectric layer that is shaped as a dielectric band extending in a first direction and the second plates are part of a plate line extending in the first direction in parallel to said dielectric band.

12. The memory array according to claim 11, wherein said plate line is positioned on and coextensive with said dielectric band.

13. The memory array according to claim 8, wherein said dielectric regions are made of ferroelectric material.

14. A memory array, comprising:

a substrate of semiconductor material;

a first stacked cell comprising a first transistor formed in the substrate and a first capacitor formed above the substrate, the first capacitor having a first plate and a second plate separated by a first dielectric region;

a second stacked cell comprising a second transistor formed in the substrate and a second capacitor formed above the substrate, the second capacitor having a first plate and a second plate separated by a second dielectric region that is continuous with the first dielectric region, the second plate of the second capacitor being continuous with the second plate of the first capacitor; and a third stacked cell comprising a third transistor formed in the substrate and a third capacitor formed above the substrate, the third capacitor having a first plate and a second plate separated from each other by a third dielectric region that is continuous with the first and second dielectric regions, the second plate of the third capacitor being continuous with the second plates of the first capacitor and the second capacitor, the first and second capacitors being positioned in a first plane that is transverse to a second plane in which the second and third capacitors are positioned.

15. The memory array according to claim 14, wherein said first plates of said capacitors form lower plates and said dielectric regions are part of a dielectric layer that runs above and between the lower plates of said capacitors.

16. The memory array according to claim 15, wherein said dielectric layer runs also on sides not facing each other of said lower plates of said capacitors.

17. The memory array according to claim 14, wherein said dielectric regions are part of a dielectric layer that is shaped as a dielectric band extending in a first direction and the second plates are part of a plate line extending in the first direction in parallel to said dielectric band.

18. The memory array according to claim 17, wherein said plate line is positioned on and coextensive with said dielectric band.

19. The memory array according to claim 14, wherein said dielectric regions are made of ferroelectric material.

20. The memory array according to claim 14 wherein the first transistor is formed in a first active region of the substrate, the second transistor is formed in a second active region of the substrate, and the third transistor is formed in a third active region of the substrate.

21. The memory array according to claim 1, wherein the MOS transistors of the pair of cells are positioned in separate active regions from each other, the separate active regions for the pair of cells being separated from each other by an insulating region.

* * * * *